US011027679B2

(12) United States Patent
Yuki

(10) Patent No.: US 11,027,679 B2
(45) Date of Patent: Jun. 8, 2021

(54) ELECTRICAL DEVICE

(71) Applicant: TOYOTA JIDOSHA KABUSHIKI KAISHA, Toyota (JP)

(72) Inventor: Keisuke Yuki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 124 days.

(21) Appl. No.: 16/534,316

(22) Filed: Aug. 7, 2019

(65) Prior Publication Data

US 2020/0070756 A1 Mar. 5, 2020

(30) Foreign Application Priority Data

Aug. 28, 2018 (JP) .............................. JP2018-159697

(51) Int. Cl.
| | | |
|---|---|---|
| *B60R 16/023* | (2006.01) | |
| *H05K 5/00* | (2006.01) | |
| *H05K 5/02* | (2006.01) | |
| *H05K 5/03* | (2006.01) | |
| *B60K 6/22* | (2007.10) | |

(52) U.S. Cl.
CPC ....... *B60R 16/0239* (2013.01); *H05K 5/0004* (2013.01); *H05K 5/0017* (2013.01); *H05K 5/0204* (2013.01); *B60K 6/22* (2013.01); *B60Y 2200/92* (2013.01); *B60Y 2410/10* (2013.01); *H05K 5/0247* (2013.01); *H05K 5/03* (2013.01)

(58) Field of Classification Search
CPC .......... B60K 6/22; B60K 6/405; B60K 6/445; B60R 16/0239; B60Y 2200/92; B60Y 2410/10; H05K 5/0004; H05K 5/0017; H05K 5/0204; H05K 5/0247; H05K 5/03; H05K 7/1432
See application file for complete search history.

(56) References Cited

U.S. PATENT DOCUMENTS

| | | | | |
|---|---|---|---|---|
| 6,628,523 B2 * | 9/2003 | Kobayashi | ........... | H05K 5/0047 361/736 |
| 9,205,749 B2 * | 12/2015 | Sakamoto | ............... | B60L 50/61 |
| 9,688,228 B2 * | 6/2017 | Azuma | ................. | H05K 5/0204 |
| 2005/0115756 A1 * | 6/2005 | Fujihara | .................. | G01P 1/023 180/271 |
| 2006/0198110 A1 * | 9/2006 | Hunkeler | ............. | H05K 5/0073 361/747 |
| 2007/0123105 A1 * | 5/2007 | Tsukashima | ......... | H01R 13/595 439/607.41 |
| 2008/0158823 A1 * | 7/2008 | Tominaga | ............ | H05K 5/0043 361/709 |

(Continued)

FOREIGN PATENT DOCUMENTS

JP 2014-043124 A 3/2014

*Primary Examiner* — Timothy J Thompson
*Assistant Examiner* — Rhadames Alonzo Miller
(74) *Attorney, Agent, or Firm* — Oliff PLC

(57) ABSTRACT

An electrical device configured to be provided in a vehicle includes a first case; and a second case that is fastened to the first case by a bolt. A side surface of the first case is provided with a columnar projection that extends along the side surface. The columnar projection is provided with a bolt insertion hole through which the bolt is inserted, the bolt insertion hole extending along the side surface. A center line of the bolt insertion hole is located closer to a center of the first case than a center line of the columnar projection is.

3 Claims, 7 Drawing Sheets

(56) References Cited

U.S. PATENT DOCUMENTS

| | | | | |
|---|---|---|---|---|
| 2010/0253188 | A1* | 10/2010 | Koyama | H05K 5/0073 |
| | | | | 312/223.1 |
| 2013/0250521 | A1* | 9/2013 | Kawai | H05K 5/0082 |
| | | | | 361/714 |
| 2013/0280953 | A1* | 10/2013 | Radeke | H05K 5/0026 |
| | | | | 439/571 |
| 2013/0314966 | A1* | 11/2013 | Sasayama | H05K 7/20927 |
| | | | | 363/141 |
| 2015/0021114 | A1* | 1/2015 | Hotta | B60L 3/0069 |
| | | | | 180/279 |
| 2015/0305177 | A1* | 10/2015 | Nakashima | H05K 5/0204 |
| | | | | 310/68 D |
| 2016/0128215 | A1* | 5/2016 | Kanzaki | H05K 5/0082 |
| | | | | 361/752 |
| 2016/0146233 | A1* | 5/2016 | Mai | H02K 5/15 |
| | | | | 403/345 |
| 2016/0295734 | A1* | 10/2016 | Ueda | H05K 7/1432 |
| 2019/0269031 | A1* | 8/2019 | Ishibashi | H05K 7/2089 |

\* cited by examiner

ELECTRICAL DEVICE

INCORPORATION BY REFERENCE

The disclosure of Japanese Patent Application No. 2018-159697 filed on Aug. 28, 2018 including the specification, drawings and abstract is incorporated herein by reference in its entirety.

BACKGROUND

1. Technical Field

The disclosure relates to an electrical device provided in a vehicle. The disclosure particularly relates to a technique of improving impact resistance of a case of an electrical device.

2. Description of Related Art

Japanese Patent Application Publication No. 2014-043124 (JP 2014-043124 A) discloses an inverter provided in a front compartment of an automobile. A case and a cover of the inverter are fixed by bolts.

SUMMARY

An electrical device provided in a vehicle includes a first case and a second case that are fastened by bolts. The electrical device is not limited to the inverter. In the disclosure, a component that is a part of a casing will be referred to as a "case" even when the component is a "cover". It is desirable that the case of the electrical device provided in a vehicle should be tough so as not to be broken by a collision shock. The disclosure provides a technique of improving strength of a fastened portion of a first case and a second case in an electrical device provided in a vehicle.

An aspect of the disclosure relates to an electrical device configured to be provided in a vehicle. The electrical device includes a first case; and a second case that is fastened to the first case by a bolt. A side surface of the first case is provided with a columnar projection that extends along the side surface. The columnar projection is provided with a bolt insertion hole through which the bolt is inserted. The bolt insertion hole extends along the side surface of the first case. A center line of the bolt insertion hole is located closer to a center of the first case than a center line of the columnar projection (a center line of a column) is. In the electrical device according to the aspect of the disclosure, a thickness of a portion of the projection, which is located outward of the bolt insertion hole, is increased, as compared to an electrical device in which the center line of the bolt insertion hole matches the center line of the projection. As a result, impact resistance is improved.

A formed-in-place gasket (FIPG) may be used to seal a portion between mating surfaces of the first case and the second case. That is, the formed-in-place gasket may be provided between the mating surfaces of the first case and the second case. In this case, in the mating surface of one of the first case and the second case, a groove may be provided between the formed-in-place gasket and the bolt insertion hole. The formed-in-place gasket is pushed outward at the time when the first case and the second case are fitted to each other with the formed-in-place gasket being held therebetween before fixation by the bolt, and the formed-in-place gasket that is pushed outward is accumulated in the groove. Thus, the bolt insertion hole is prevented from being closed by the formed-in-place gasket that is pushed outward.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
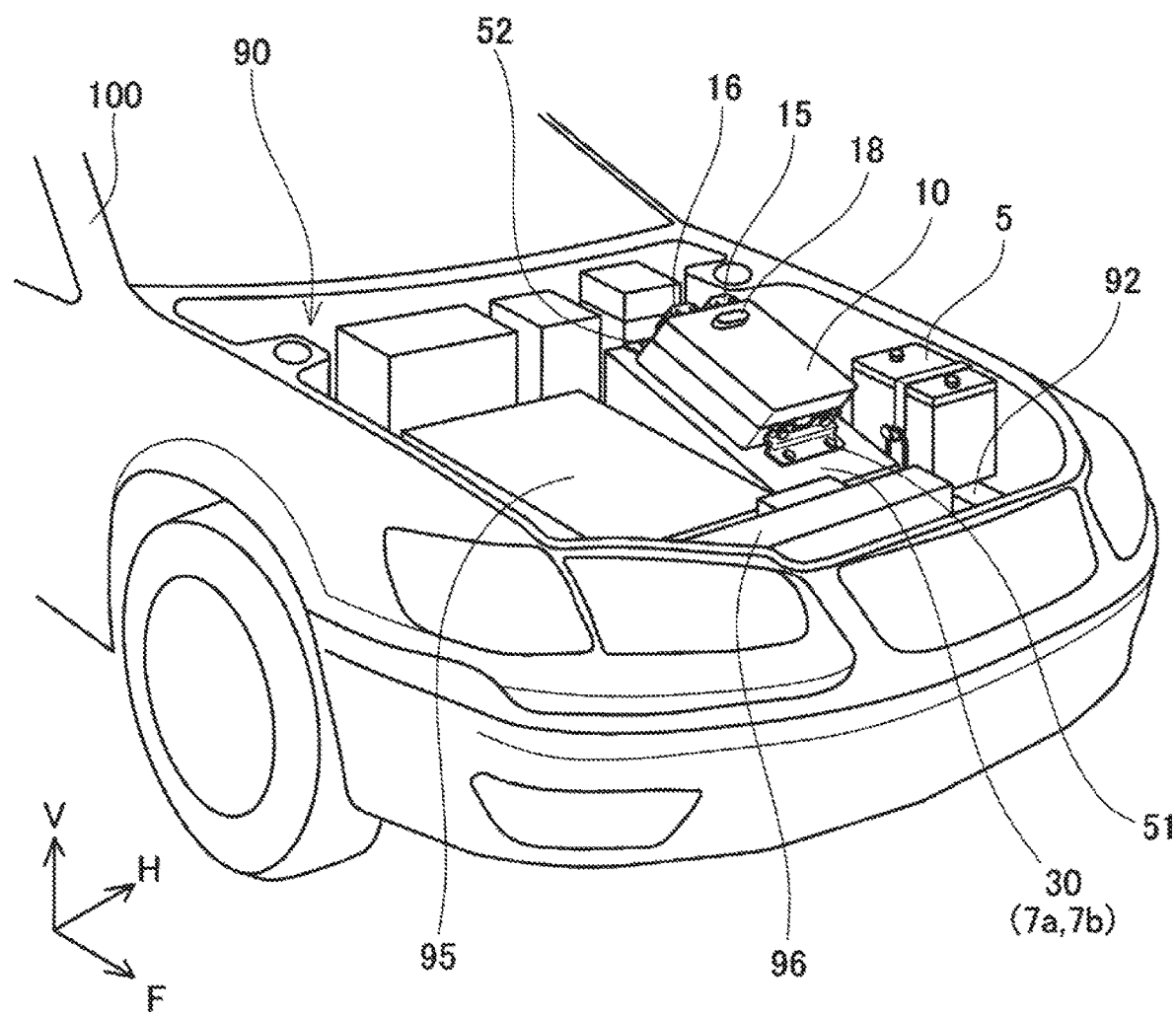
FIG. 1 is a perspective view illustrating a device layout in a front compartment of a hybrid vehicle.
Figure 2:
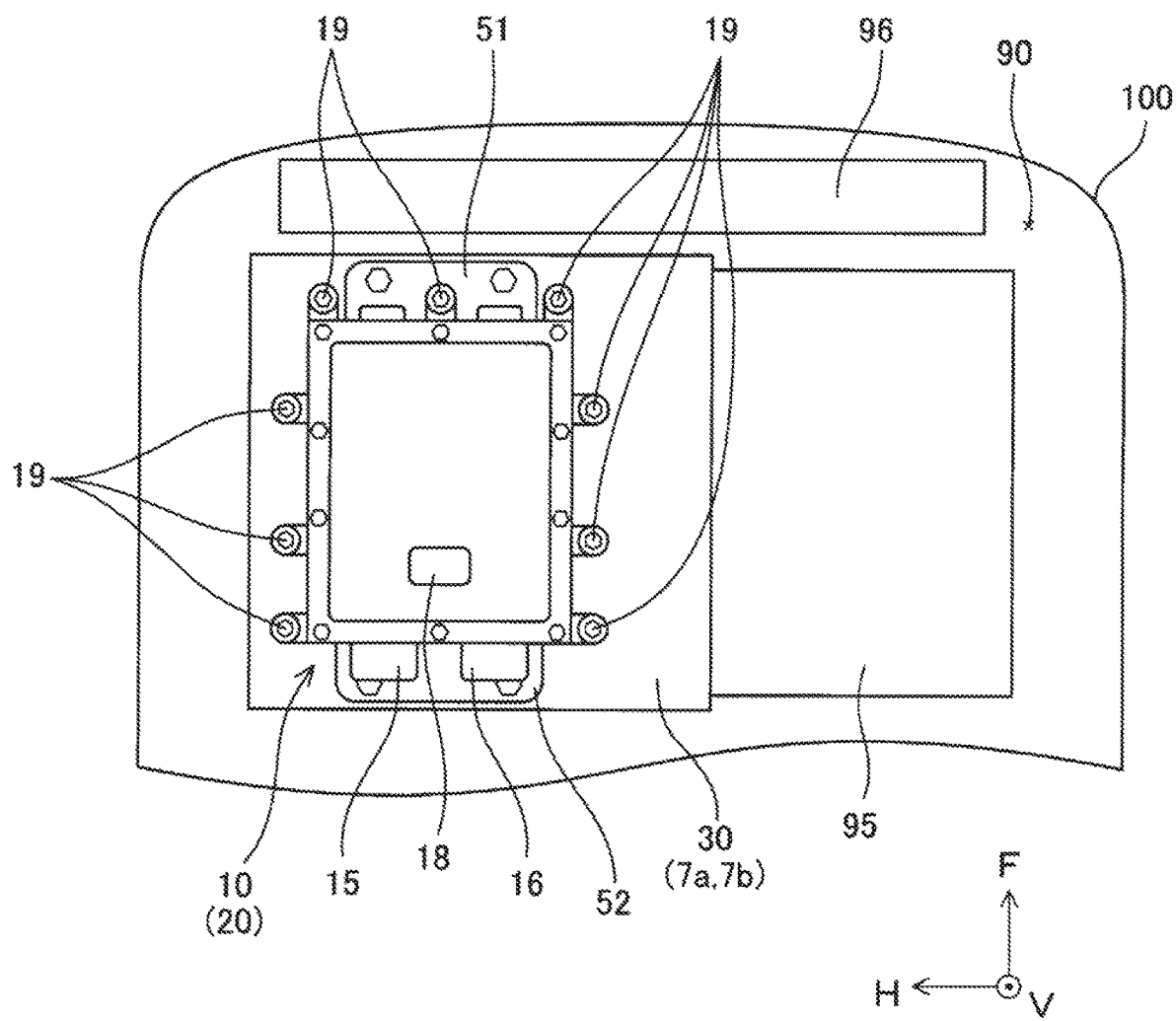
FIG. 2 is a plan view of the front compartment.

A description will be made on an electrical device in an embodiment with reference to the drawings. The electrical device in the embodiment is an electric power control unit that is provided in a hybrid vehicle including an engine and a motor for traveling. FIG. 1 is a perspective view illustrating a device layout in a front compartment 90 of the hybrid vehicle 100. FIG. 2 is a plan view of the front compartment 90. In a coordinate system of the drawings, a positive direction of F-axis indicates a forward direction with respect to the vehicle, and a positive direction of V-axis indicates an upward direction with respect to the vehicle. A positive direction of H-axis indicates a leftward direction with respect to the vehicle. In FIG. 1, devices provided in the front compartment 90 are schematically illustrated. In particular, a case 20 of an electric power control unit 10, which will be described later in detail, is divided in an up-down direction into an upper case and a lower case, and peripheries of the upper case and the lower case are fastened by bolts. However, fastened portions are not illustrated. FIG. 2 illustrates a plurality of fastened portions 19 on the periphery of the case 20 of the electric power control unit 10. In FIG. 2, an auxiliary battery 5, which is illustrated in FIG. 1, is not illustrated.

In the front compartment 90, an engine 95, a transaxle 30, the electric power control unit 10, the auxiliary battery 5, a radiator 96, and the like are accommodated. Although various other devices are also accommodated in the front compartment 90, those will be neither illustrated nor described.

The hybrid vehicle 100 includes two motors 7a, 7b and the engine 95 for traveling. The two motors 7a, 7b are accommodated in a housing of the transaxle 30. In addition to the two motors 7a, 7b for traveling, a power split mechanism and a differential gear are accommodated in the transaxle 30. The transaxle 30 and the engine 95 are coupled to each other, and the power split mechanism is a gear set that combines/splits output torque of the engine 95 and output torque of each of the motors 7a, 7b. When the high torque is requested, the power split mechanism combines the output torque of the engine 95 and the output torque of the motors 7a, 7b and transmits the combined torque to the differential gear. In addition, in accordance with a situation, the power split mechanism splits the output torque of the engine 95 and transmits the split torque to the differential gear and the motor 7a. In this case, the power is generated by the motor 7a while the hybrid vehicle 100 travels with the use of the engine torque. The motor 7b also functions as a starter that starts the engine 95.

The engine 95 and the transaxle 30 are coupled to be adjacent to each other in a vehicle width direction. The engine 95 and the transaxle 30 are provided on two side members 92 that secure structural strength of the vehicle. In FIG. 1, one of the side members is not illustrated.

The electric power control unit 10 is fixed to an upper surface of the transaxle 30. The electric power control unit 10 is a device that boosts DC power of a main battery, which is not illustrated, and converts the boosted DC power to AC power suited for driving of the motor. As illustrated in FIG. 2, the electric power control unit 10 is disposed at a position slightly closer to a left end of the upper surface of the transaxle 30 than to a right end of the upper surface of the transaxle 30. Two connectors (a DC power connector 15 and an air-conditioner connector 16) are connected to a rear surface of the case 20 of the electric power control unit 10, and one connector (a low-voltage connector 18) is connected to an upper surface thereof. In FIG. 1 and FIG. 2, a cable connected to the low-voltage connector 18 is not illustrated.

Figure 3:
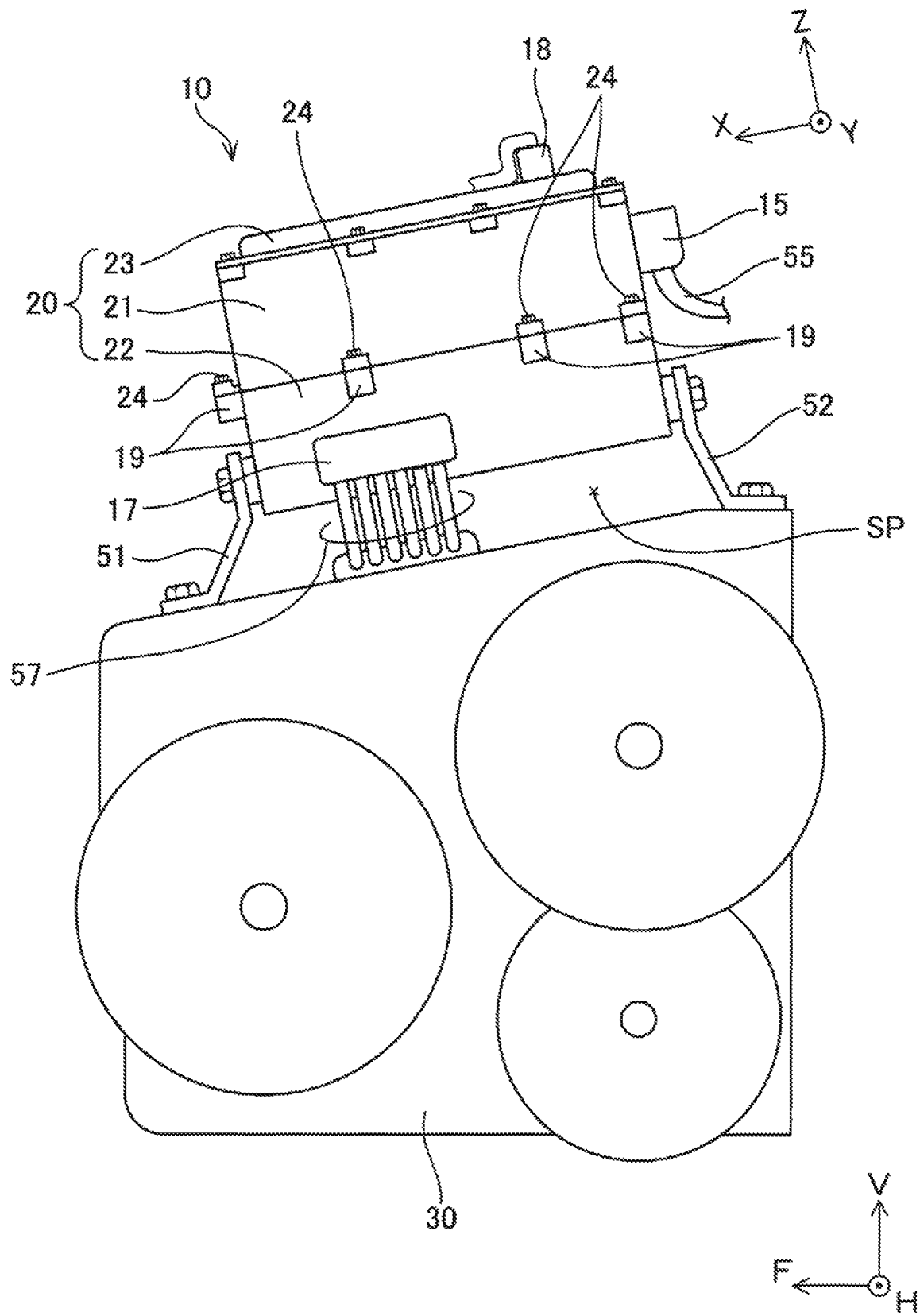
FIG. 3 is a side view of a transaxle and an electric power control unit.

FIG. 3 is a side view of the electric power control unit 10 and the transaxle 30. An upper surface of the transaxle 30 is tilted downward in a forward direction (i.e., in a direction toward the front of the hybrid vehicle 100). Thus, the electric power control unit 10 is fixed to the upper surface of the transaxle 30 so as to be tilted downward in the forward direction (i.e., in the direction toward the front of the hybrid vehicle 100). An XYZ coordinate system illustrated in FIG. 3 is a coordinate system provided for the electric power control unit 10. An X-axis extends in parallel with a bottom surface of the case 20 of the electric power control unit 10, a Z-axis extends in parallel with the rear surface of the case 20, and a Y-axis extends along the vehicle width direction.

With the use of a front bracket 51 and a rear bracket 52, the electric power control unit 10 is fixed to the upper surface of the transaxle 30 with a clearance SP being interposed between the electric power control unit 10 and the upper surface of the transaxle 30. The clearance SP is provided to reduce vibrations that are transferred from the transaxle 30 to the electric power control unit 10. A vibration-proof bush, which is not illustrated, is held between the front bracket 51 and the case 20. A vibration-proof bush, which is not illustrated, is also held between the rear bracket 52 and the case 20. A connector (a motor connector 17) for power cables 57 that transmit the electric power to the motors 7a, 7b in the transaxle 30 is connected to a left surface of the case 20.

The case 20 of the electric power control unit 10 is configured to include an upper case 21 including an upper opening and a lower opening; an upper cover 23 that covers the upper opening of the upper case 21; and a lower case 22 that is coupled to the lower opening of the upper case 21. The upper cover 23 is fixed to the upper case 21 by a plurality of bolts. The upper case 21 and the lower case 22 are arranged in the up-down direction, and peripheries thereof are fastened to each other by a plurality of bolts 24. As illustrated in FIG. 2, the upper case 21 and the lower case 22 are coupled to each other at the nine fastened portions 19.

Figure 4:
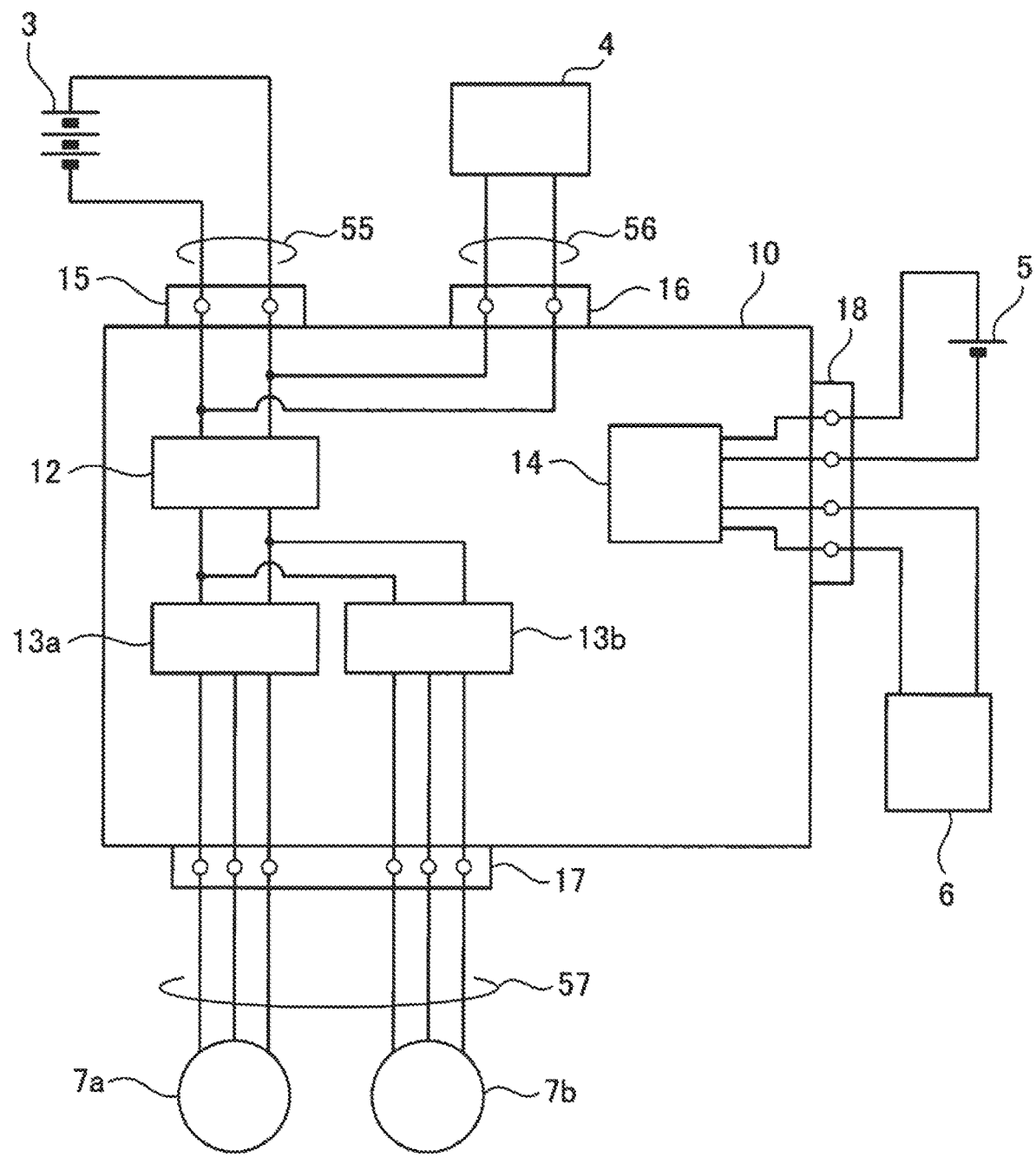
FIG. 4 is a block diagram of the electric power control unit and peripheral devices in the vicinity of the electric power control unit in the hybrid vehicle.

Referring to FIG. 4, a circuit configuration of the electric power control unit 10 will be described. FIG. 4 is a block diagram of the inside of the electric power control unit 10 and peripheral devices connected to the electric power control unit 10. The electric power control unit 10 includes therein a converter circuit 12, two inverter circuits 13a, 13b, and a control board 14 that controls the converter circuit 12 and the inverter circuits 13a, 13b.

The electric power control unit 10 is connected to a main battery 3 via a DC power cable 55. A reference numeral 15 denotes the connector (the DC power connector 15) that is attached to a distal end of the DC power cable 55. Output of the main battery 3 is equal to or higher than 100 volts, and the motors 7a, 7b are driven with the use of electric power of the main battery 3. The converter circuit 12 receives the output electric power of the main battery 3. The converter circuit 12 boosts the output voltage of the main battery 3 and supplies the boosted output voltage to the inverter circuits 13a, 13b. Each of the inverter circuits 13a, 13b converts the boosted DC power to the AC power suited for driving of the motor. As described with reference to FIG. 3, the output of the inverter circuits 13a, 13b is supplied to the motors 7a, 7b via the motor connector 17 and the power cables 57.

The converter circuit 12 and the inverter circuits 13a, 13b are controlled by a control circuit mounted on the control board 14. The control circuit on the control board 14 is operated when being supplied with the electric power from the auxiliary battery 5. The control circuit on the control board 14 is operated when receiving a command from an external high-order controller 6. The auxiliary battery 5 and the high-order controller 6 are connected to the control board 14 of the electric power control unit 10 via communication cables and the low-voltage connector 18.

The auxiliary battery 5 supplies the electric power to other devices operated at 12 volts, in addition to the control board 14 in the electric power control unit 10. Among the devices provided in the hybrid vehicle 100, the devices operated at 12 volts will collectively be referred to as auxiliary machines. The auxiliary battery 5 is provided in the front compartment 90 (see FIG. 1).

A casing of the electric power control unit 10 also serves as an electric power relay between the main battery 3 and an air-conditioner compressor 4. The electric power of the main battery 3 is supplied from the electric power control unit 10 to the air-conditioner compressor 4 via an air-conditioner cable 56 and the air-conditioner connector 16.

The case 20 of the electric power control unit 10 will be further described. As illustrated in FIG. 1 to FIG. 3, the electric power control unit 10 is fixed to the transaxle 30 in the front compartment 90 such that the electric power control unit 10 is disposed above the transaxle 30. The case 20 of the electric power control unit 10 is divided into the upper case 21 and the lower case 22, and those are fastened to each other at the plurality of fastened portions 19 on the peripheries of the upper case 21 and the lower case 22. When a frontal collision of the vehicle occurs, a collision load is applied to the case 20 from the front. Because a large number of components, through each of which the high voltage equal to or higher than 100 volts flows, is accommodated in the case 20, the case 20 is required to have high collision resistance (high impact resistance).

The fastened portions 19 of the upper case 21 and the lower case 22 project from a periphery of the case 20 (peripheries of facing surfaces of the upper case 21 and a lower case 22, the facing surfaces facing each other). Each of the fastened portions 19 projecting from the periphery of the case 20 is significantly influenced by the collision load.

Figure 5:
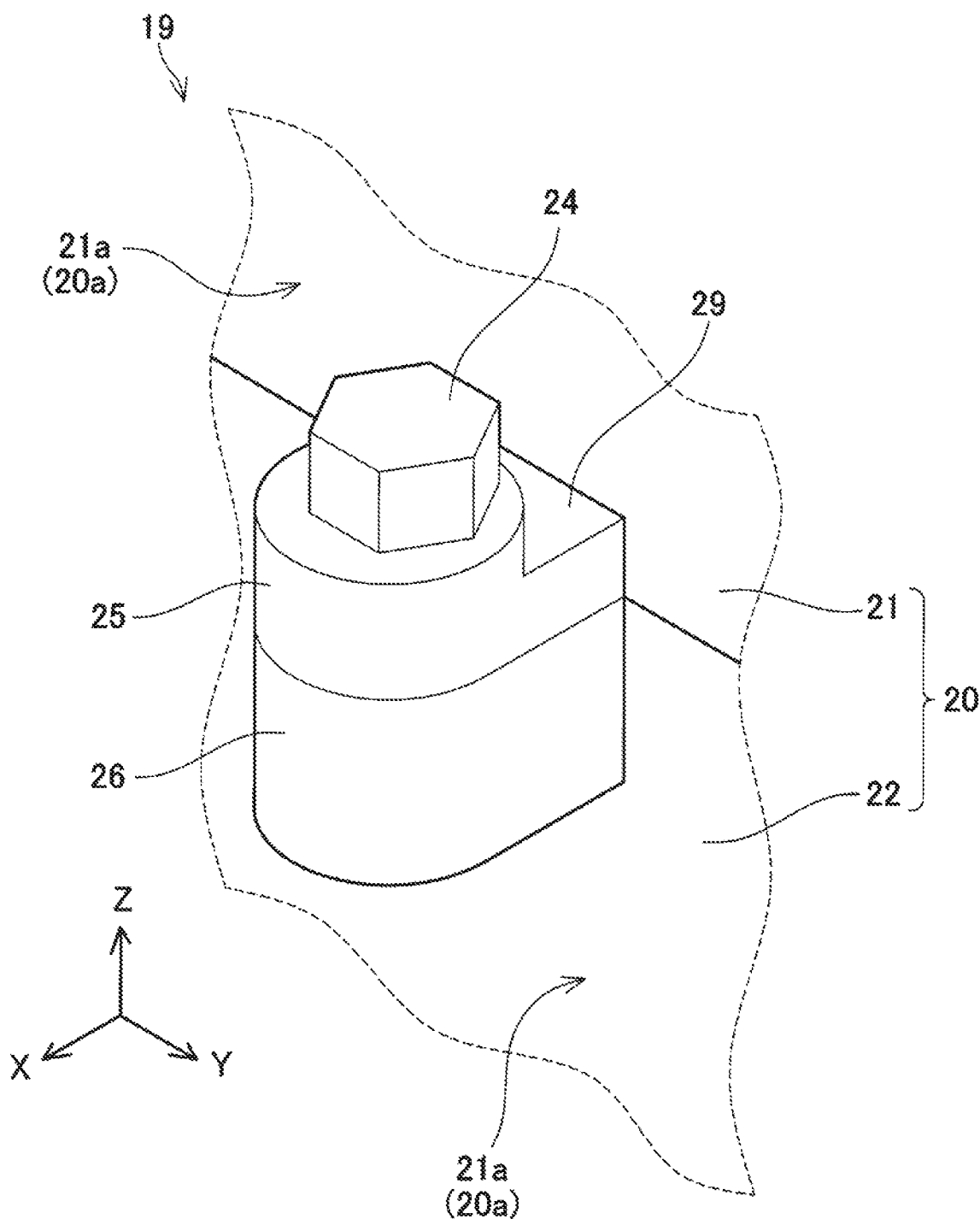
FIG. 5 is an enlarged perspective view of a fastened portion.

FIG. 5 is an enlarged view of the fastened portion 19. The upper case 21 and the lower case 22 are fastened by the bolt 24. A tab 29 projects from a side surface 21a of the upper case 21 (a side surface 20a of the case 20), and a columnar projection 25 extends upward from the tab 29. The projection 25 extends along the side surface 21a of the upper case 21 (the side surface 20a of the case 20). A bolt insertion hole 25a (will be described later) is provided on an upper surface of the projection 25. Meanwhile, a tab 26 projects from a side surface 22a of the lower case 22 (the side surface 20a of the case 20), and the tab 26 is provided with a bolt fixation hole 26a (will be described later). The bolt fixation hole 26a is provided with a female thread such that the bolt 24 can be fixed in the bolt fixation hole 26a. The bolt 24 is inserted through the bolt insertion hole 25a in the projection 25 of the upper case 21 and is fixed to the bolt fixation hole 26a of the lower case 22. The bolt insertion hole 25a and the bolt fixation hole 26a extend along the side surface 20a of the case 20. More specifically, the bolt insertion hole 25a and the bolt fixation hole 26a extend along a direction (a Z-direction in the drawings) in which the upper case 21 and the lower case 22 are arranged.

Figure 6A:
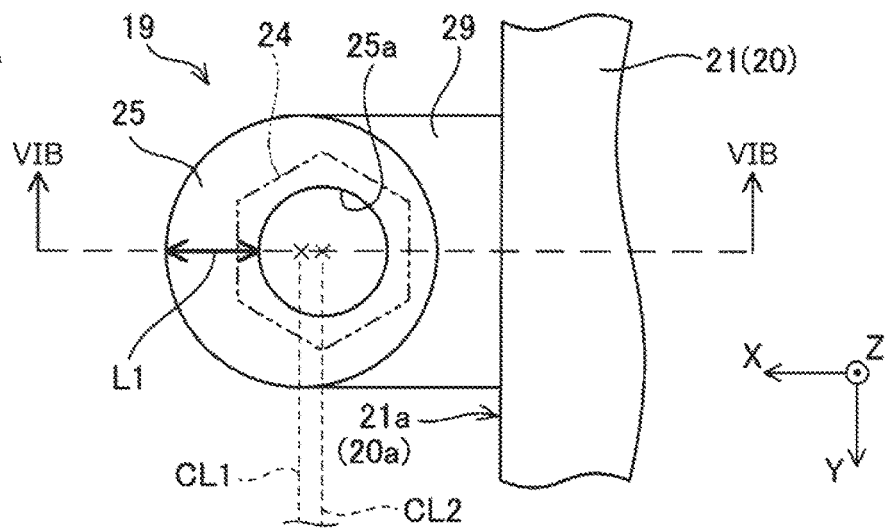
FIG. 6A is a plan view of the fastened portion.
Figure 6B:
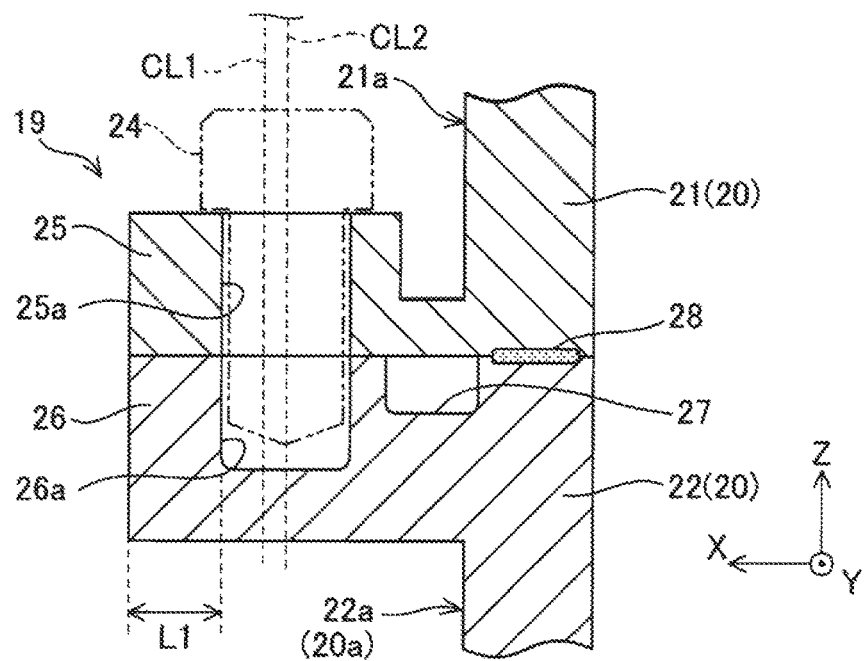
FIG. 6B is a sectional view taken along line VIB-VIB in FIG. 6A.
Figure 6C:
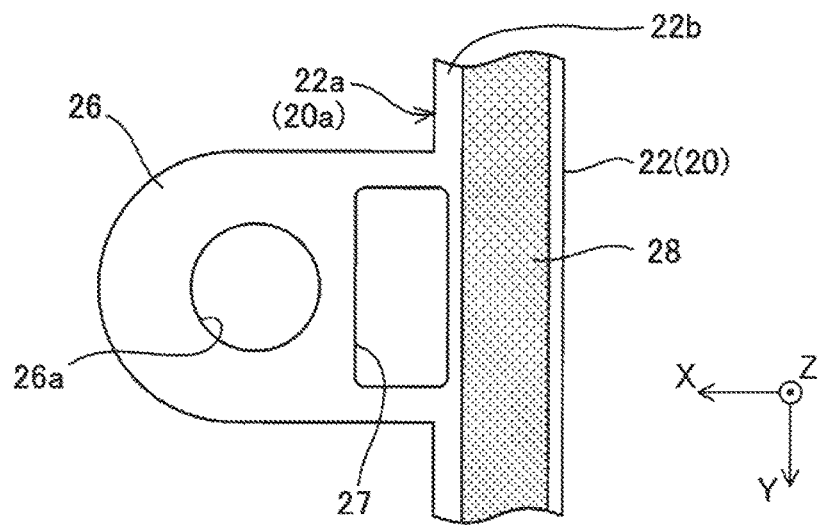
FIG. 6C is a plan view of the fastened portion of a lower case.

FIG. 6A is a plan view of the fastened portion 19. FIG. 6B is a sectional view taken along line VIB-VIB in FIG. 6A. FIG. 6C is a plan view of the fastened portion 19 of the lower case 22. As described above, the projection 25 has a columnar shape, and a broken line CL1 in FIGS. 6A and 6B represents a center line of the projection 25. Meanwhile, a broken line CL2 represents a center line of the bolt insertion hole 25a. As illustrated in FIGS. 6A and 6B, the center line of the bolt insertion hole 25a (the broken line CL2) is located closer to a center of the upper case 21 than the center line of the projection 25 (the broken line CL1) is. Thus, as compared to a case where the broken line CL1 and the broken line CL2 match each other, a thickness of a portion of the projection 25, which is located outward of the bolt insertion hole 25a, is increased (i.e., a distance L1 illustrated in FIGS. 6A and 6B is increased). As a result, the impact resistance of the fastened portion 19 is improved.

A formed-in-place gasket (FIPG) 28 is held (provided) between mating surfaces of the upper case 21 and the lower case 22. The mating surfaces signify a lower surface of a side wall around an opening of the upper case 21 and an upper surface 22b of a side wall around an opening of the lower case 22. The FIPG 28 seals a portion between the mating surface of the upper case 21 and the mating surface (the upper surface 22b) of the lower case 22. Although the FIPG 28 is a liquid at first, the FIPG 28 is solidified in a few minutes to a few hours after being applied to the mating surfaces. When the upper case 21 and the lower case 22 are coupled to each other with the FIPG 28 being held therebetween, the FIPG 28 receives a pressure and thereby expands. In the case where the FIPG 28 before solidification enters the bolt insertion hole 25a or the bolt fixation hole 26a, it becomes difficult to insert the bolt 24 therein. For this reason, a groove 27 (see FIGS. 6B and 6C) is provided between the FIPG 28 and the bolt fixation hole 26a (the bolt insertion hole 25a) in the mating surface (the upper surface 22b) of the lower case 22. When the upper case 21 and the lower case 22 are fitted to each other, the FIPG 28 that is pushed out is accumulated in the groove 27, and thus is prevented from entering the bolt fixation hole 26a or the bolt insertion hole 25a. That is, the bolt insertion hole 25a or the bolt fixation hole 26a is not closed by the FIPG 28 that is pushed outward.

As described above, the upper case 21 and the lower case 22 are fastened to each other at the plurality of fastened portions 19. In all of the fastened portions 19, the center line of the bolt insertion hole 25a may be located closer to the center of the case than the center line of the projection 25 is. Alternatively, in only some of the fastened portions 19, a position of the center line of the bolt insertion hole 25a may be shifted to a position closer to the center of the case. In the following description, the fastened portion in which the center line of the bolt insertion hole 25a is located closer to the center of the case than the center line of the projection 25 is will be referred to as the "fastened portion in which the position of the center line of the bolt insertion hole 25a is shifted".

Figure 7:
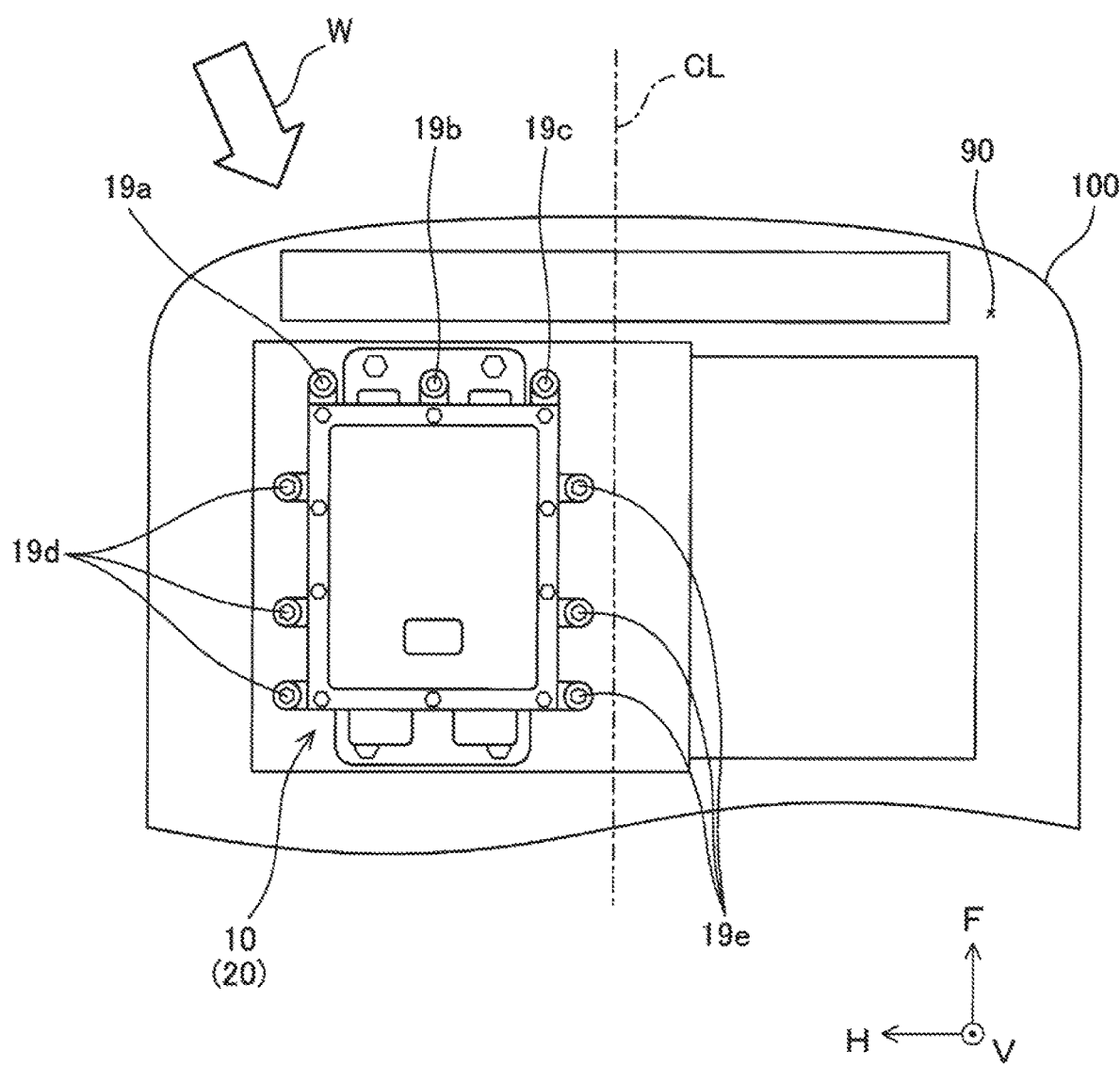
FIG. 7 is a plan view of the front compartment, in which a collision load is illustrated.

FIG. 7 is a plan view of the front compartment 90. An arrow W schematically represents the collision load. An alternate long and short dash line CL represents a center line in a lateral direction (right-left direction) of the vehicle. An English character is added to the reference numeral of each of the plurality of fastened portions 19 in accordance with positions. A front-left fastened portion will be denoted by the reference numeral and symbol 19a, a front-center fastened portion will be denoted by the reference numeral and symbol 19b, and a front-right fastened portion will be denoted by the reference numeral and symbol 19c. Each of the three fastened portions on the left side will be denoted by the reference numeral and symbol 19d, and each of the three fastened portions on the right side will be denoted by the reference numeral and symbol 19e.

The electric power control unit 10 is disposed in a left-half region of the front compartment 90. In the case of the frontal collision, the front-left fastened portion 19a receives the largest load. The front-center fastened portion 19b receives the second largest load, and the front-right fastened portion 19c receives the third largest load. Each of the fastened portions 19d on the left side receives the fourth largest load, and the load applied to each of the fastened portions 19e on the right side is the smallest. Accordingly, in the front-left, front-center, and front-right fastened portions 19a, 19b, 19c, the center line of the bolt insertion hole 25a may be shifted. In addition, in the remaining fastened portions 19d, 19e, the center line of the bolt insertion hole 25a may match the center line of the projection 25. Alternatively, in the front-left and front-center fastened portions 19a, 19b, the center line of the bolt insertion hole 25a may be shifted. In addition, in the remaining fastened portions 19c, 19d, 19e, the center line of the bolt insertion hole 25a may match the center line of the projection 25.

Points to note that relate to the technique described in the embodiment will be described. In the electric power control unit 10 according to the embodiment, the projection 25 extends in the direction in which the upper case 21 and the lower case 22 are arranged. The bolt insertion hole 25a and the bolt fixation hole 26a also extend in the direction in which the upper case 21 and the lower case 22 are arranged. In the electrical device disclosed in the disclosure, the projection 25, which is provided with the bolt insertion hole 25a, may extend in any direction as long as the projection 25 extends along the side surface of the case 20. For example, the projection 25 may be provided to extend in a horizontal direction along the side surface of the case 20.

The projection 25 of the electric power control unit 10 according to the embodiment has the columnar shape. The projection 25 is not limited to the columnar shape with a true circle section and may have the columnar shape with an oval section. The technique disclosed in the disclosure may be applied to an in-vehicle device other than the electric power control unit.

The upper case 21 in the embodiment is an example of the first case, and the lower case 22 is an example of the second case. However, the first case may be the lower case. For example, the lower case (i.e., the first case) may be provided with a projection extending along the side surface of the lower case, and the first case and the second case may be fastened by inserting the bolt through the projection. The direction in which the bolt insertion hole extends may not be the direction in which the upper case and the lower case are arranged. The bolt insertion hole may extend in any direction as long as the bolt insertion hole extends along the side surface provided with the projection. The technique disclosed in the disclosure can also be applied to an electrical device including a case that is divided in the lateral direction (right-left direction). The technique disclosed in the disclosure can further be applied to an electrical device including a case that is divided into three or more divided cases.

The embodiment of the disclosure has been described so far in detail. However, the embodiment is merely illustrative and does not limit the scope of the disclosure. The disclosure includes various modifications and changes that are made to the embodiment described so far. The technical elements described in the disclosure demonstrate technical utility when used singly or in various combinations, and thus the combinations of the technical elements are not limited to the combinations described in the disclosure. In addition, the techniques that are described in the disclosure achieve a plurality of objects simultaneously, and technical utility is provided by achieving at least one of the objects.

What is claimed is:

1. An electrical device configured to be provided in a vehicle, the electrical device comprising:

a first case; and a second case that is fastened to the first case by a bolt, wherein a side surface of the first case is provided with a columnar projection that extends along the side surface, the columnar projection is provided with a bolt insertion hole through which the bolt is inserted, the bolt insertion hole extending along the side surface, and a center line of the bolt insertion hole is located closer to a center of the first case than a center line of the columnar projection is.

2. The electrical device according to claim 1, wherein:

a formed-in-place gasket is provided between mating surfaces of the first case and the second case; and in the mating surface of one of the first case and the second case, a groove is provided between the formed-in-place gasket and the bolt insertion hole.

3. The electrical device according to claim 1, wherein a tab projects from the side surface, and the columnar projection extends along the side surface from the tab.

* * * * *